(12) United States Patent
De Silva et al.

(10) Patent No.: US 10,395,925 B2
(45) Date of Patent: Aug. 27, 2019

(54) PATTERNING MATERIAL FILM STACK COMPRISING HARD MASK LAYER HAVING HIGH METAL CONTENT INTERFACE TO RESIST LAYER

(71) Applicant: International Business Machines Corporation, Armonk, NY (US)

(72) Inventors: Ekmini Anuja De Silva, Slingerlands, NY (US); Adra Carr, Albany, NY (US); Shanti Pancharatnam, Albany, NY (US); Indira Seshadri, Niskayuna, NY (US); Yasir Sulehria, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/857,124

(22) Filed: Dec. 28, 2017

(65) Prior Publication Data

US 2019/0206681 A1    Jul. 4, 2019

(51) Int. Cl.
*H01L 21/00* (2006.01)
*H01L 21/033* (2006.01)
(Continued)

(52) U.S. Cl.
CPC ............ *H01L 21/0335* (2013.01); *G03F 7/11* (2013.01); *H01L 21/0274* (2013.01);
(Continued)

(58) Field of Classification Search
None
See application file for complete search history.

(56) References Cited

U.S. PATENT DOCUMENTS 4,637,129 A    1/1987  Derkits, Jr. et al.
6,087,269 A *  7/2000  Williams .......... H01L 21/32139
                                                      257/E21.035
(Continued)

FOREIGN PATENT DOCUMENTS

KR    20030043027 A    6/2003

OTHER PUBLICATIONS

IBM, "Self Aligned Undercut Structure Using Tungsten Hard Mask," ip.com No. IPCOM000018953D, Aug. 22, 2003, 10 pages.

*Primary Examiner* — Evren Seven
(74) *Attorney, Agent, or Firm* — Vazken Alexanian; Ryan, Mason & Lewis, LLP

(57) ABSTRACT

A lithographic patterning method includes forming a multi-layer patterning material film stack on a semiconductor substrate. Forming the patterning material film stack includes forming a hard mask layer and forming a resist layer over the hard mask layer. The hard mask layer is formed such that an interface portion of the hard mask layer proximate the resist layer has a higher metal content than other portions of the hard mask layer. The method further includes exposing the patterning material film stack to patterning radiation to form a desired pattern in the resist layer, developing the pattern formed in the resist layer, etching the hard mask layer in accordance with the developed pattern, and removing remaining portions of the resist layer. The hard mask layer illustratively includes metal oxide, metal nitride and/or metal oxynitride, and may exhibit an elevated surface hydrophobicity due to its high metal content interface portion.

20 Claims, 3 Drawing Sheets

(51) Int. Cl.
*H01L 21/027* (2006.01)
*G03F 7/11* (2006.01)
*H01L 21/308* (2006.01)
*G03F 7/30* (2006.01)
*G03F 7/20* (2006.01)

(52) U.S. Cl.
CPC ...... *H01L 21/0332* (2013.01); *H01L 21/0337* (2013.01); *H01L 21/3081* (2013.01); *G03F 7/20* (2013.01); *G03F 7/30* (2013.01)

(56) References Cited

U.S. PATENT DOCUMENTS

| | | | |
|---|---|---|---|
| 6,420,099 B1 * | 7/2002 | Gutsche | H01L 21/32139 216/100 |
| 6,815,364 B2 * | 11/2004 | Stojakovic | H01L 21/02071 257/E21.311 |
| 6,989,219 B2 | 1/2006 | Magg | |
| 7,442,648 B2 | 10/2008 | Kim et al. | |
| 7,727,902 B2 | 6/2010 | Takei et al. | |
| 9,152,052 B2 | 10/2015 | Noya | |
| 9,929,012 B1 * | 3/2018 | Belyansky | G03F 7/00 |
| 2007/0158632 A1 | 7/2007 | Ho | |
| 2012/0034551 A1 * | 2/2012 | Yoshikawa | G03F 1/14 430/5 |
| 2012/0223418 A1 * | 9/2012 | Stowers | C23C 18/06 257/632 |
| 2013/0059235 A1 * | 3/2013 | Inazuki | G03F 1/14 430/5 |
| 2016/0013070 A1 * | 1/2016 | Jeon | H01L 21/31144 438/478 |
| 2016/0035569 A1 | 2/2016 | Rumer et al. | |
| 2017/0092495 A1 * | 3/2017 | Chen | G03F 7/091 |
| 2018/0149960 A1 * | 5/2018 | Chen | G03F 1/28 |
| 2018/0210331 A1 * | 7/2018 | Kajiwara | G03F 1/32 |
| 2018/0277390 A1 * | 9/2018 | Nakanishi | H01L 21/32134 |
| 2018/0358220 A1 * | 12/2018 | Yu | H01L 21/02019 |
| 2019/0080908 A1 * | 3/2019 | Lee | H01L 21/0337 |

* cited by examiner

PATTERNING MATERIAL FILM STACK COMPRISING HARD MASK LAYER HAVING HIGH METAL CONTENT INTERFACE TO RESIST LAYER

BACKGROUND

The present application relates to manufacturing of semiconductor integrated circuits, and more particularly to patterning of semiconductor integrated circuit features using lithography processes. As part of the ongoing world-wide effort to shrink integrated circuit device dimensions, a variety of single-pattern and multiple-pattern lithography processes based on deep ultraviolet (DUV) radiation wavelengths such as 193 nanometers (193 nm) have come into widespread use, although further extension of such arrangements to the patterning of features at production nodes below 10 nm may be problematic. Recent development of extreme ultraviolet (EUV) lithography processes using wavelengths such as 13.5 nm are expected to facilitate the accurate patterning of features at sub-10 nm production nodes, but there remain significant difficulties in the practical implementation of EUV processes. For example, conventional techniques often fail to provide adequate adhesion between the hard mask and resist layers, leading to potential problems such as resist lift-off. It can therefore be unduly difficult to pattern the resist layer directly on the hard mask layer in some lithographic processes.

SUMMARY

Illustrative embodiments of the invention provide a hard mask layer for use in a patterning material film stack in an EUV lithography process. The hard mask layer is particularly configured so as to include a high metal content interface to an overlying resist layer in the patterning material film stack. Such an arrangement can significantly improve adhesion between the hard mask layer and the resist layer, thereby avoiding problems such as resist lift-off and facilitating direct patterning of the resist layer on the hard mask layer. This can in turn lead to lower defect rates in lithographic patterning and corresponding reductions in integrated circuit manufacturing costs. Moreover, the high metal content interface of the hard mask layer also advantageously serves to increase the EUV sensitivity of the patterning material film stack due to secondary electron effects, which can allow reductions in wafer exposure times and/or power requirements of EUV radiation sources, resulting in increased wafer throughput rates and associated additional cost reductions.

In one embodiment, a lithographic patterning method comprises forming a multi-layer patterning material film stack on a semiconductor substrate. Forming the patterning material film stack more particularly comprises forming a hard mask layer and forming a resist layer over the hard mask layer. The hard mask layer is formed such that an interface portion of the hard mask layer proximate the resist layer has a higher metal content than other portions of the hard mask layer. The method further comprises exposing the multi-layer patterning material film stack to patterning radiation to form a desired pattern in the resist layer, developing the pattern formed in the resist layer, etching the hard mask layer in accordance with the developed pattern, and removing remaining portions of the resist layer.

The hard mask layer illustratively comprises at least one of metal oxide, metal nitride and metal oxynitride, and the interface portion of the hard mask layer comprises a lower percentage of said at least one of metal oxide, metal nitride and metal oxynitride than the other portions of the hard mask layer. The interface portion of the hard mask layer proximate the resist layer exhibits an elevated surface hydrophobicity through the relatively high metal content of the interface portion.

In another embodiment, a semiconductor structure comprises a semiconductor substrate and a multi-layer patterning material film stack formed on the semiconductor substrate. The patterning material film stack comprises at least a hard mask layer and a resist layer formed over the hard mask layer. An interface portion of the hard mask layer proximate the resist layer has a higher metal content than other portions of the hard mask layer.

In a further embodiment, a multi-layer patterning material film stack comprises a hard mask layer and a resist layer formed over the hard mask layer. An interface portion of the hard mask layer proximate the resist layer has a higher metal content than other portions of the hard mask layer.

DETAILED DESCRIPTION

Figure 1:
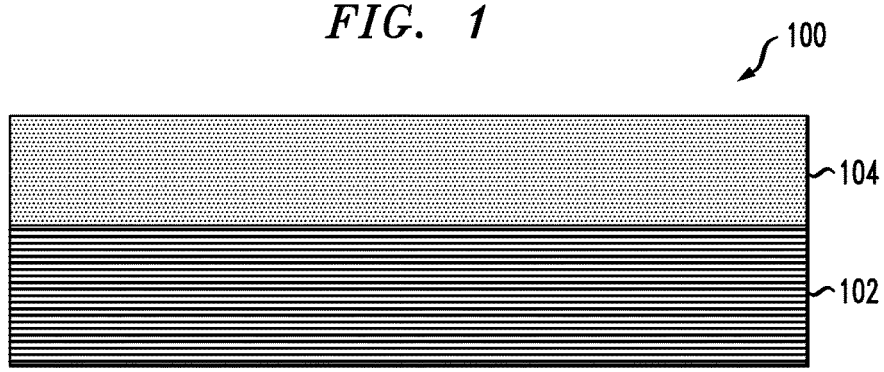
FIG. 1 shows a cross-sectional view of a semiconductor structure following formation of an organic planarizing layer on a semiconductor substrate in an illustrative embodiment.

Illustrative embodiments are described herein in the context of EUV lithography processes and associated patterning material film stacks and hard mask layers. However, it is to be understood that embodiments of the invention are not limited to these illustrative arrangements, but are instead more broadly applicable to a wide variety of different lithography processes, patterning material film stacks, hard mask layers and other features and functionality. For example, other embodiments are not limited to use with any particular single-pattern or multiple-pattern EUV lithography process but can be applied to a wide variety of other types of lithography processes, including both single-pattern and multiple-pattern DUV lithography processes. Also, the particular arrangements of layers utilized within the patterning material film stack can be varied in other embodiments. Moreover, the particular components of the hard mask layer and its manner of formation can be varied in other embodiments. These and numerous other variations in the disclosed arrangements will be apparent to those skilled in the art.

Illustrative embodiments involve forming a hard mask layer that is specifically configured to have improved adhesion to an overlying resist layer in a multi-layer patterning material film stack. For example, the hard mask layer illustratively comprises an interface portion proximate the resist layer that is specifically formed so as to have a higher metal content than other portions of the hard mask layer. Such an arrangement provides improved adhesion between the hard mask layer and the resist layer, thereby facilitating direct patterning of the resist layer on the hard mask layer, while avoiding problems such as lift-off of the resist layer. This can in turn lead to lower defect rates in lithographic patterning and corresponding reductions in integrated circuit manufacturing costs. Additional advantages such as increased EUV sensitivity of the patterning material film stack are provided, which can allow reductions in wafer exposure times and/or power requirements of EUV radiation sources FIGS. 1 through 7 show a portion of an EUV lithography process involving the formation of a hard mask layer having a high metal content interface to an overlying resist layer of a patterning material film stack in an illustrative embodiment. The EUV lithography process is applied to a semiconductor wafer in conjunction with the manufacture of integrated circuits. The figures illustrate respective cross-sectional views of a portion of the semiconductor wafer as it undergoes sequential processing operations as part of the EUV lithography process. It is to be appreciated that the various elements and other features shown in these figures are simplified for clarity and simplicity of illustration and are not necessarily drawn to scale.

It should also be noted that references herein to formation of one layer or structure "on" or "over" another layer or structure are intended to be broadly construed, and should not be interpreted as precluding the presence of one or more intervening layers or structures.

Referring initially to FIG. 1, a semiconductor structure 100 represents a portion of a semiconductor wafer having a semiconductor substrate 102. At least portions of the semiconductor substrate 102 may be formed of silicon (Si), and may have a thickness of about 500 to 1000 micrometers (μm). The semiconductor substrate 102 may itself comprise multiple layers, although it is shown as a single layer in the figure, again for clarity and simplicity of illustration. The semiconductor structure 100 further comprises an organic planarizing layer (OPL) 104. The OPL 104 in some embodiments is formed to a thickness of approximately 60 nm, although these and other dimensions are presented herein as illustrative examples and should not be construed as limiting. The OPL 104 in the present embodiment is a lower-most layer of what is referred to herein as a "multi-layer patterning material film stack," although such a film stack in other embodiments need not include OPL 104.

Figure 2:
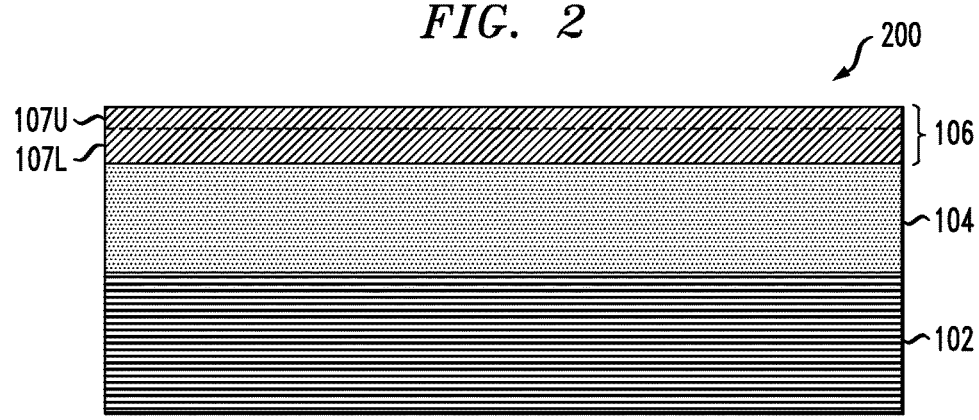
FIG. 2 shows a cross-sectional view of a semiconductor structure following formation of a hard mask layer over an organic planarizing layer in an illustrative embodiment.

As shown in FIG. 2, a hard mask layer 106 is formed over the OPL 104, resulting in the semiconductor structure 200. The hard mask layer 106 is illustratively a metal-containing hard mask layer formed of materials such as metal oxides, metal nitrides and/or metal oxynitrides, although a wide variety of other metal-containing materials could be used. The hard mask layer 106 in this embodiment is a second layer of the multi-layer patterning material film stack, overlying the OPL 104. The hard mask layer 106 may have a thickness in the range of about 3 nm to 15 nm.

The hard mask layer 106 in this embodiment comprises an interface portion 107U that has a higher metal content than other portions of the hard mask layer 106, such as non-interface portions 107L which represent all remaining portions of the hard mask layer 106 other than the interface portion 107U. The interface portion 107U provides a high metal content interface between the hard mask layer 106 and an overlying resist layer that will be described in conjunction with subsequent figures. The interface portion 107U is illustratively an upper portion of the hard mask layer 106, and the non-interface portions 107L collectively comprise a lower portion of the hard mask layer 106. Both interface and non-interface portions 107U and 107L are part of the hard mask layer 106, and are formed integrally with the hard mask layer 106 as part of the formation of that layer.

The hard mask layer 106 is illustratively formed by a deposition process, such as atomic layer deposition (ALD), chemical vapor deposition (CVD) or physical vapor deposition (PVD). More particularly, the deposition process utilized to form the hard mask layer 106 in some embodiments comprises a fluorine-free and non-nucleation deposition process.

As noted above, the hard mask layer 106 may comprise metal oxide, metal nitride and/or metal oxynitride. The interface portion 107U of the hard mask layer 106 is specifically formed within the deposition process so as to comprise a lower percentage of the metal oxide, metal nitride and/or metal oxynitride than the other portions 107L of the hard mask layer 106. For example, the interface portion 107U of the hard mask layer 106 contain less than about 60% metal oxide, metal nitride and/or metal oxynitride, and therefore a relatively high concentration of metal atoms, while the other portions 107L contain more than about 60% metal oxide, metal nitride and/or metal oxynitride, and therefore a relatively low concentration of metal atoms.

These variations in the metal content of the different portions 107U and 107L of the hard mask layer 106 can be introduced by varying the parameters of the deposition process as the hard mask layer 106 is formed over the OPL 104. Such variations can be introduced through straightforward modification of conventional deposition processes, as will be readily apparent to those skilled in the art.

The concentration percentage amounts in this context and other similar contexts herein refer to mole percent (mol %). It is to be appreciated that different relative percentages of metal content can be used in other embodiments in order to form the high metal content interface portion 107U relative to other portions 107L. Accordingly, the 60% metal oxide figure presented above is by way of non-limiting example only.

In some embodiments, the hard mask layer 106 comprises a metal oxide film of the form MeOx, where Me denotes a metal atom and x is in the range of 2 to 4.

Additionally or alternatively, the hard mask layer 106 may comprise a metal oxynitride film of the form MeOxNy, where Me denotes a metal atom, x is in the range of 2 to 4 and y is in the range of 0.75-1.25.

The particular metal or metals used to form the hard mask layer 106 illustratively comprise at least one of a transition metal and a post-transition metal. For example, the metal content of the hard mask layer 106 may comprise at least one transition metal such as tungsten (W) or hafnium (Hf). As another example, the metal content of the hard mask layer 106 may comprise at least one post-transition metal such as tin (Sn) or aluminum (Al).

The above-noted metals are examples of what are more generally referred to herein as "high-Z" atoms, where Z denotes the atomic number of the atom, and alternative high-Z atoms can be used in hard mask layer 106 in other embodiments.

The hard mask layer 106 in the present embodiment has a metal-rich surface in the interface portion 107U relative to other portions 107L. As indicated above, the concentration of metal oxide, metal nitride and/or metal oxynitride in the interface portion 107U is reduced relative to that of the other portions 107L, thereby providing a higher metal concentration in the interface portion 107U than in the other portions 107L. Terms such as "high" and "higher" used in conjunction with the metal content of an interface portion of a hard mask layer are relative terms, relative to metal content in other non-interface portions of the hard mask layer, and should not construed as requiring particular absolute metal content levels.

The configuration of the interface portion 107U to include a higher metal content than the other portions 107L provides the interface portion 107U with an elevated surface hydrophobicity, which enhances the adhesion between the hard mask layer 106 and an overlying resist layer. This facilitates patterning of the overlying resist layer directly on the hard mask layer 106, which provides significant additional benefits in terms of simplifying the patterning process and reducing EUV radiation exposure times. Moreover, such an arrangement avoids the need for surface enhancement treatments or organic underlayers, both of which can unduly complicate the patterning process.

The high metal content interface 107U of the hard mask layer 106 also serves to increase EUV sensitivity due to secondary electron effects, which can allow further reductions in wafer exposure times and/or power requirements of EUV radiation sources. This can in turn lead to increased wafer throughput rates and corresponding reductions in integrated circuit manufacturing costs.

Although the interface portion 107U and non-interface portions 107L of the hard mask layer 106 in this embodiment are illustrated as respective regions separated by a horizontal dashed line in the figure, this is for clarity and simplicity of illustration only. The transition between the regions may in practice be a gradual one. In addition, the regions may have different shapes and configurations in other embodiments. Accordingly, the term "interface portion" as used herein with reference to a hard mask layer is intended to be broadly construed, so as to encompass regions of various shapes or configurations that are proximate to an upper surface of the hard mask layer over which a resist layer is formed.

Figure 3:
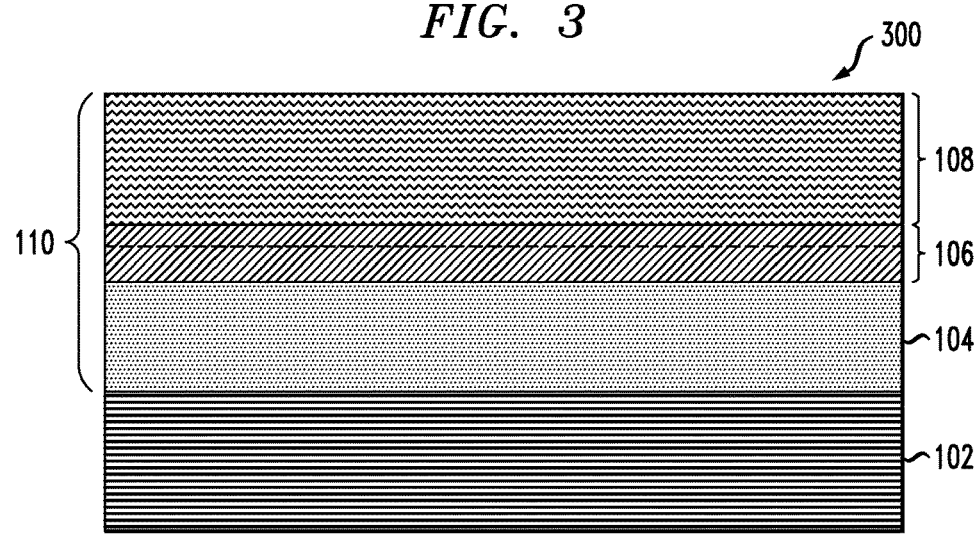
FIG. 3 shows a cross-sectional view of a semiconductor structure following formation of a resist layer over a hard mask layer in an illustrative embodiment.

Turning now to FIG. 3, a resist layer 108 is formed over the hard mask layer 106, resulting in the semiconductor structure 300. This structure 300 includes a multi-layer patterning material film stack 110 that includes the OPL 104, the hard mask layer 106 and the resist layer 108. The resist layer comprises a photosensitive material suitable for patterning using a EUV radiation source and a corresponding photomask. The resist layer 108 illustratively comprises an organic EUV photoresist, and more particularly an organic chemically-amplified photoresist, although other types of resist materials can be used. The resist layer 108 may have a thickness in the range of about 10 nm to 30 nm. The resist layer 108 may be subject to a post-application bake (PAB) process, at a temperature of about 150° C., although other processes can be used.

In other embodiments, the multi-layer patterning material film stack 110 can include additional or alternative layers underlying the resist layer 108. Accordingly, the particular multi-layer patterning material film stack 110 shown in the figure is presented by way of illustrative example only. A given such film stack will generally comprise a resist layer formed over one or more additional layers. The one or more additional layers in the present example comprise the OPL 104 and the hard mask layer 106.

The hard mask layer 106 in some embodiments is configured to increase the EUV sensitivity of the patterning material film stack 110 by increasing generation of secondary electrons in the resist layer 108. The high metal content interface 107U of the hard mask layer in such embodiments enhances the ability of the resist layer 108 to absorb EUV radiation by allowing it to capture more EUV photons during exposure. For example, the resist material of the resist layer 108 can undergo enhanced sensitivity through selective infiltration of and subsequent reaction with components of the interface portion 107U of the hard mask layer 106. As a more particular example, metal components may infiltrate into or otherwise become part of the resist layer 108.

As mentioned previously, EUV radiation exposure times and/or EUV power source requirements can be reduced as a result of such secondary electron generation effects, leading to improvements in wafer throughput rates.

Moreover, these and other embodiments comprising a hard mask layer with a high metal content interface can significantly increase EUV sensitivity without sacrificing patterned feature resolution or adversely impacting patterning quality metrics such as line edge roughness (LER) and line width roughness (LWR).

Figure 4:
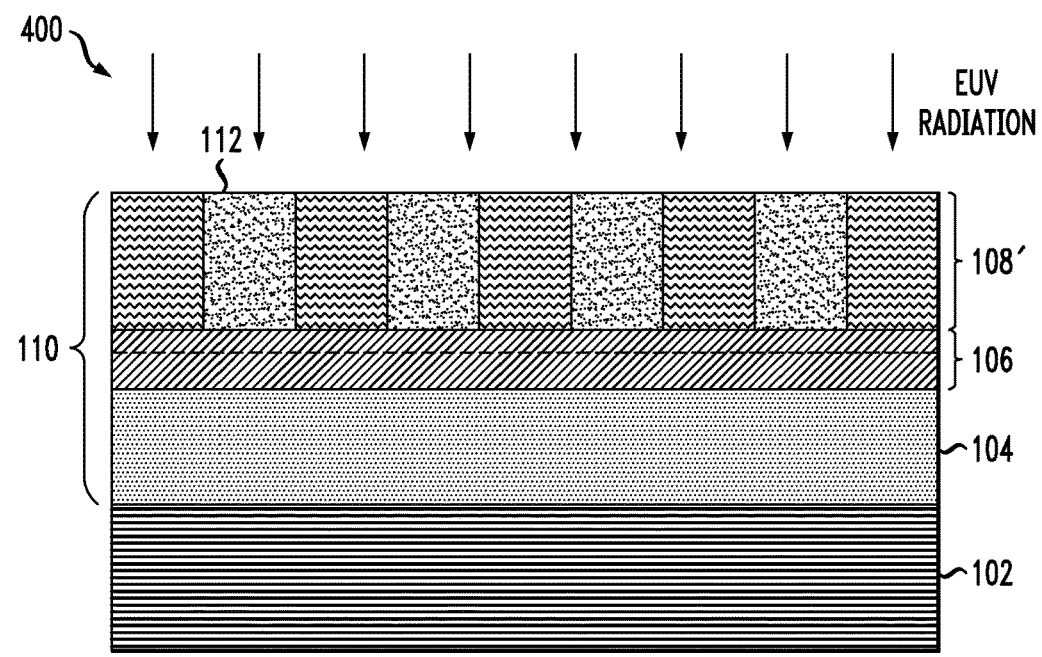
FIG. 4 shows a cross-sectional view of a semiconductor structure under exposure to EUV radiation in conjunction with patterning of a resist layer in an illustrative embodiment.

Referring now to FIG. 4, the multi-layer patterning material film stack 110 is exposed to EUV patterning radiation to form a desired pattern in the resist layer 108. The pattern includes features such as feature 112. The resulting semiconductor structure 400 includes a patterned resist layer denoted by reference numeral 108' in the figure.

Figure 5:
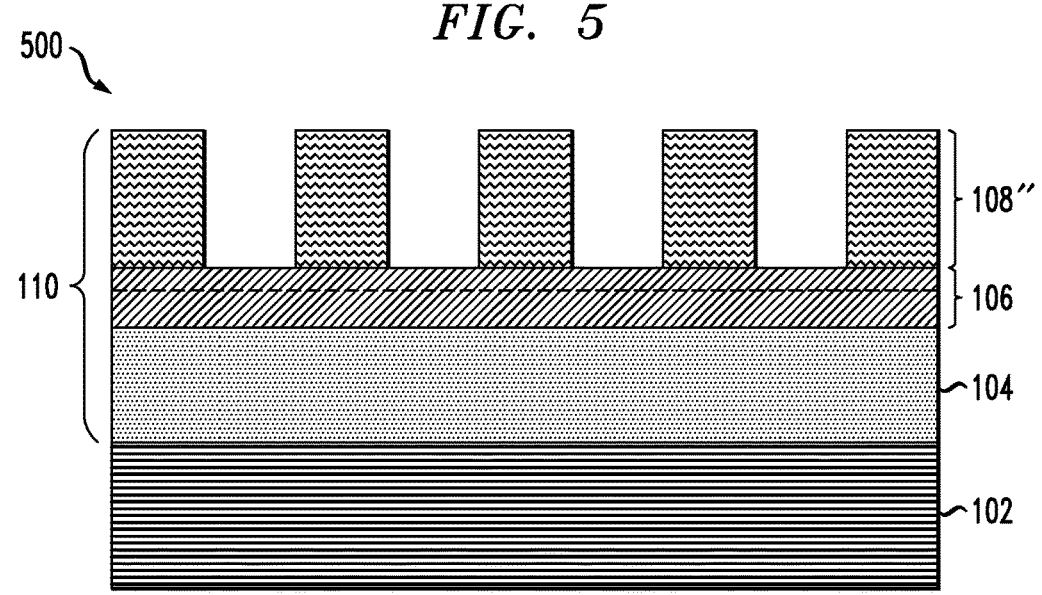
FIG. 5 shows a cross-sectional view of a semiconductor structure following development of a pattern in a resist layer in an illustrative embodiment.

The patterned resist layer 108' is then developed, resulting in the semiconductor structure 500 as shown in FIG. 5. For example, the patterned resist layer 108' may be developed using a developer solution. Development of the patterned resist layer 108' results in a developed resist layer 108" in which portions of the resist layer are removed in accordance with the pattern.

Figure 6:
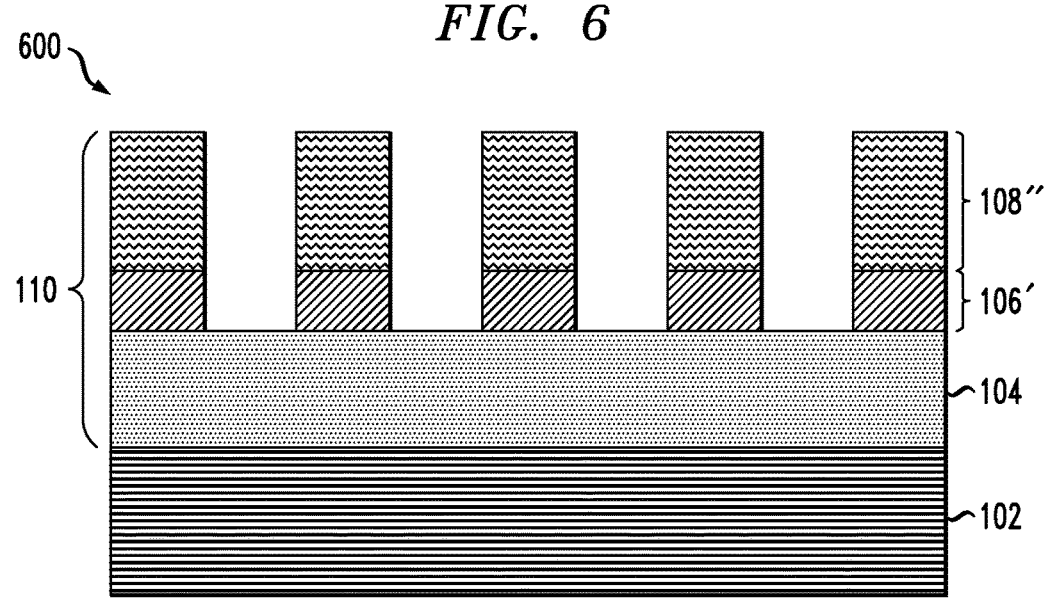
FIG. 6 shows a cross-sectional view of a semiconductor structure following etching of a hard mask layer in accordance with a pattern formed in a resist layer in an illustrative embodiment.

As shown in FIG. 6, the hard mask layer 106 underlying the developed resist layer 108" is etched in accordance with the developed pattern to produce the semiconductor structure 600. This part of the process results in transfer of the pattern from the developed resist layer 108" to patterned hard mask layer 106' as shown. The etching can be performed using a process such as reactive ion etching (RIE) or wet etching.

Figure 7:
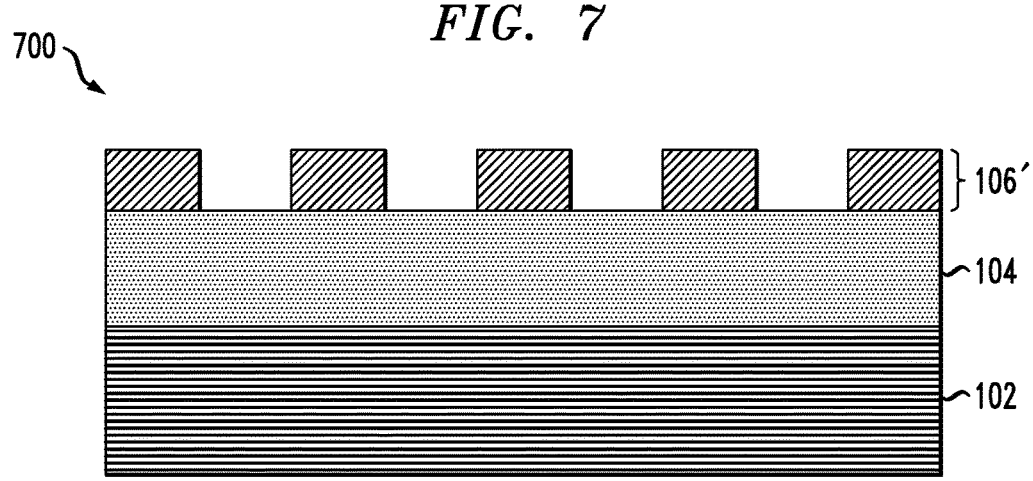
FIG. 7 shows a cross-sectional view of a semiconductor structure showing an etched hard mask layer after removal of remaining portions of a resist layer in an illustrative embodiment.

Remaining portions of the developed resist layer 108" are then removed, as shown in FIG. 7, resulting in the semiconductor structure 700. The semiconductor structure 700 is then subject to additional processing operations of a type well known to those skilled in the art, in order to form desired integrated circuit structures on the semiconductor wafer. For example, portions of the process as previously described in conjunction with FIGS. 1 through 7 can be repeated with different pattern masks in order to further configure the hard mask layer in accordance with additional pattern features.

In other embodiments, other types of multi-layer patterning material film stacks may be used. For example, in some embodiments, additional or alternative layers may be included in the patterning material film stack with the hard mask layer. These and numerous other lithographic patterning arrangements using a hard mask layer having a high metal content interface can be implemented using the techniques disclosed herein, as will be appreciated by those skilled in the art.

Illustrative embodiments can include a semiconductor structure comprising a semiconductor substrate and a multi-layer patterning material film stack formed on the semiconductor substrate. The patterning material film stack comprises at least a hard mask layer and a resist layer formed over the hard mask layer. An interface portion of the hard mask layer proximate the resist layer has a higher metal content than other portions of the hard mask layer.

Other illustrative embodiments can include a multi-layer patterning material film stack comprising a hard mask layer and a resist layer formed over the hard mask layer. An interface portion of the hard mask layer proximate the resist layer has a higher metal content than other portions of the hard mask layer. The hard mask layer may be formed over a semiconductor substrate or on other types of substrates, layers or materials.

Additional illustrative embodiments include lithography tools and other types of lithographic patterning equipment that are configured to perform lithographic processes such as those described above in conjunction with the manufacture of semiconductor integrated circuits. For example, an EUV lithography tool such as the ASML NXE:3300B or NXE:3350B operating at a wavelength of 13.5 nm can be modified to perform an EUV lithography process of the type described above that includes forming a hard mask layer having a high metal content interface using the techniques disclosed herein. Again, other types of lithography processes and associated lithography tools can be used, based on patterning radiation at DUV wavelengths or other wavelengths, and the techniques disclosed herein are therefore not limited to use with EUV lithography processes or EUV lithography tools.

Examples of integrated circuit structures that can be formed using EUV lithography processes as disclosed herein include nanosheet metal-oxide-semiconductor field-effect transistor (MOSFET) devices. The use of a hard mask layer having a high metal content interface as disclosed herein can facilitate the manufacture of such devices by enhancing the adhesion between the hard mask layer and an overlying resist layer, thereby facilitating the patterning of the resist layer directly on the hard mask layer. Moreover, such embodiments can increase the EUV sensitivity of the multi-layer patterning material film stack, thereby facilitating the formation of sub-10 nm features. Similar improvements are provided for alternative ranges of feature sizes, such as sub-50 nm features. A wide variety of other types of integrated circuit devices can be fabricated using an EUV lithography process that includes one or more iterations of at least portions of the steps shown in FIGS. 1 through 7.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

It is to be understood that the various layers, structures, and/or regions described above are not necessarily drawn to scale. In addition, for ease of explanation one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Terms such as "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Also, in the figures, the illustrated scale of one layer, structure, and/or region relative to another layer, structure, and/or region is not necessarily intended to represent actual scale.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

In some embodiments, the above-described techniques are used in connection with manufacture of semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A lithographic patterning method, comprising:
   forming a multi-layer patterning material film stack on a semiconductor substrate, wherein forming the patterning material film stack comprises forming a hard mask layer and forming a resist layer over the hard mask layer, and wherein an interface portion of the hard mask layer proximate the resist layer has a higher metal content than other portions of the hard mask layer;
   exposing the multi-layer patterning material film stack to patterning radiation to form a desired pattern in the resist layer;
   developing the pattern formed in the resist layer;
   etching the hard mask layer in accordance with the developed pattern; and
   removing remaining portions of the resist layer.

2. The method of claim 1 wherein the multi-layer patterning material film stack comprises one or more additional layers including at least an organic planarizing layer.

3. The method of claim 2 wherein the hard mask layer is formed over the organic planarizing layer.

4. The method of claim 1 wherein the hard mask layer is formed by a deposition process.

5. The method of claim 4 wherein the deposition process comprises one of atomic layer deposition (ALD), chemical vapor deposition (CVD) and physical vapor deposition (PVD).

6. The method of claim 4 wherein the deposition process comprises a fluorine-free and non-nucleation deposition process.

7. The method of claim 1 wherein the hard mask layer comprises at least one of metal oxide, metal nitride and metal oxynitride, and wherein the interface portion of the hard mask layer comprises a lower percentage of said at least one of metal oxide, metal nitride and metal oxynitride than the other portions of the hard mask layer.

8. The method of claim 7 wherein the interface portion of the hard mask layer comprises less than about 60% in mole percent of said at least one of metal oxide, metal nitride and metal oxynitride.

9. The method of claim 1 wherein the hard mask layer comprises a metal oxide film of the form MeOx, where Me denotes a metal atom and x is in the range of 2 to 4.

10. The method of claim 1 wherein the hard mask layer comprises a metal oxynitride film of the form MeOxNy, where Me denotes a metal atom, x is in the range of 2 to 4 and y is in the range of 0.75-1.25.

11. The method of claim 1 wherein the metal content of the hard mask layer comprises at least one of a transition metal and a post-transition metal.

12. The method of claim 11 wherein the metal content of the hard mask layer comprises at least one transition metal and said at least one transition metal comprises at least one of tungsten (W) and hafnium (Hf).

13. The method of claim 11 wherein the metal content of the hard mask layer comprises at least one post-transition metal and said at least one post-transition metal comprises at least one of tin (Sn) and aluminum (Al).

14. The method of claim 1 wherein the interface portion of the hard mask layer proximate the resist layer is provided with an elevated surface hydrophobicity through the relatively high metal content of the interface portion.

15. A semiconductor structure comprising:
   a semiconductor substrate; and
   a multi-layer patterning material film stack formed on the semiconductor substrate;
   the patterning material film stack comprising at least a hard mask layer and a resist layer formed over the hard mask layer;
   wherein an interface portion of the hard mask layer proximate the resist layer has a higher metal content than other portions of the hard mask layer.

16. The semiconductor structure of claim 15 wherein the hard mask layer comprises at least one of metal oxide, metal nitride and metal oxynitride, and wherein the interface portion of the hard mask layer comprises a lower percentage of said at least one of metal oxide, metal nitride and metal oxynitride than the other portions of the hard mask layer.

17. The semiconductor structure of claim 15 wherein the interface portion of the hard mask layer proximate the resist layer is provided with an elevated surface hydrophobicity through the relatively high metal content of the interface portion.

18. A multi-layer patterning material film stack comprising:
   a hard mask layer; and
   a resist layer formed over the hard mask layer;
   wherein an interface portion of the hard mask layer proximate the resist layer has a higher metal content than other portions of the hard mask layer.

19. The multi-layer patterning material film stack of claim 18 wherein the hard mask layer comprises at least one of metal oxide, metal nitride and metal oxynitride, and wherein the interface portion of the hard mask layer comprises a lower percentage of said at least one of metal oxide, metal nitride and metal oxynitride than the other portions of the hard mask layer.

20. The multi-layer patterning material film stack of claim 18 wherein the interface portion of the hard mask layer proximate the resist layer is provided with an elevated surface hydrophobicity through the relatively high metal content of the interface portion.

* * * * *